United States Patent [19]
Kolluri

[11] Patent Number: 5,446,414
[45] Date of Patent: Aug. 29, 1995

[54] SIMPLE HIGH SPEED PRECISION TRANSCONDUCTANCE AMPLIFIER CIRCUITS

[75] Inventor: Madhav V. Kolluri, Sunnyvale, Calif.

[73] Assignee: Maxim Integrated Products, Sunnyvale, Calif.

[21] Appl. No.: 313,546

[22] Filed: Sep. 27, 1994

[51] Int. Cl.[6] ............................................... H03F 3/18
[52] U.S. Cl. ..................... 330/288; 330/299; 330/310
[58] Field of Search ............... 323/315, 316; 330/288, 330/299, 310

[56] References Cited

U.S. PATENT DOCUMENTS 5,311,146  5/1994  Brannon et al. ............... 323/315 X Primary Examiner—James B. Mullins
Attorney, Agent, or Firm—Blakely, Sokoloff, Taylor & Zafman

[57] ABSTRACT

A simple high speed precision transconductance amplifier circuit having a low offset. The circuit uses as an input stage two substantially identical transistors of a first conductivity type connected in series so as to have the same current there through, neglecting base currents. A second stage uses two substantially identical transistors of a second conductivity type connected in series, with the output of the amplifier being a current mirrored from the second stage. The offset is maintained low by maintaining the $V_{BE}$ of the transistors in the two stages substantially identical by connecting together the base and collector of one of the transistors in one stage and coupling the resulting $V_{BE}$ of the transistor so coupled to one of the transistors of opposite conductivity type in the other stage. Various embodiments and variations are disclosed.

14 Claims, 3 Drawing Sheets

SIMPLE HIGH SPEED PRECISION TRANSCONDUCTANCE AMPLIFIER CIRCUITS

BACKGROUND OF THE INVENTION

1. Field of the Invention

The present invention relates to the field of transconductance amplifiers.

2. Prior Art

A transconductance element is a basic building block frequently used to generate many analog functions. Many transconductance circuits are well known in the prior art. Conventional transconductance circuit topologies utilize a high gain amplifier in a negative feedback circuit to control a transconductance element. However these topologies take up more die area and are usually of slower speed than the present invention.

BRIEF SUMMARY OF THE INVENTION

A simple high speed precision transconductance amplifier circuit having a low offset. The circuit uses as an input stage two substantially identical transistors of a first conductivity type connected in series so as to have the same current there through, neglecting base currents. A second stage uses two substantially identical transistors of a second conductivity type connected in series, with the output of the amplifier being a current mirrored from the second stage. The offset is maintained low by maintaining the $V_{BE}$ of the transistors in the two stages substantially identical by connecting together the base and collector of one of the transistors in one stage and coupling the resulting $V_{BE}$ of the transistor so coupled to one of the transistors of opposite conductivity type in the other stage. Various embodiments and variations are disclosed.

DETAILED DESCRIPTION OF THE INVENTION

The requirement of an ideal transconductance circuit is to generate an output current $$I_{out} = \frac{V_{IN}}{R}.$$

Figure 1:
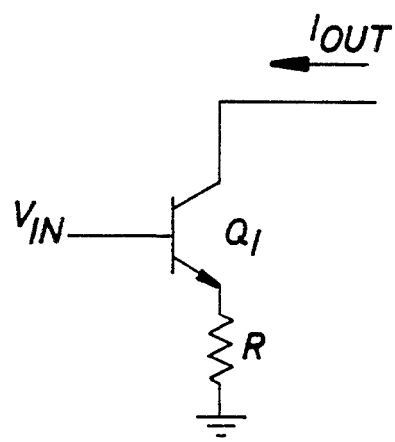
FIG. 1 presents a simple transconductance circuit.

Also the input impedance of an ideal circuit should be very high. A simple transconductance circuit is shown in FIG. 1 wherein:

$$I_{out} = \frac{V_{IN} - V_{Be}}{R}$$

Figure 2:
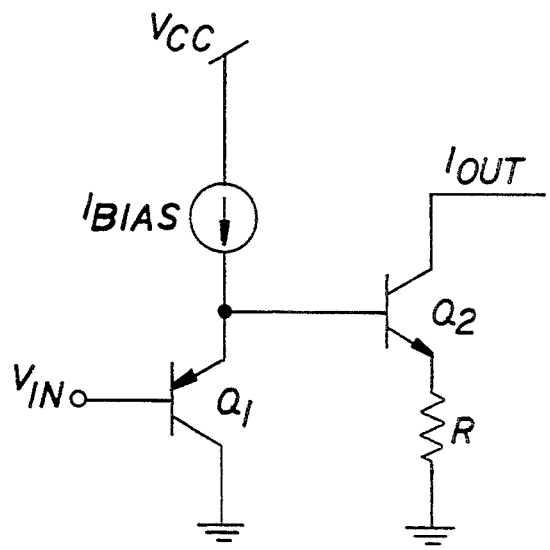
FIG. 2 show an improvement to the circuit of FIG. 1 to reduce the offset characteristic of the circuit of FIG. 1.

In this circuit, the $V_{BE}$ of $Q_1$ creates an offset. Also the circuit is non-linear due to the dependence of $V_{BE}$ on the operating current, especially when the input voltage is close to ground. A circuit to reduce the offset is shown in FIG. 2, wherein:

$$I_{out} = \frac{V_{IN} + V_{BE1} - V_{BE2}}{R}$$

The difference in the $V_{BE}$ of the PNP transistor $Q_1$ and the NPN transistor $Q_2$ is smaller than the $V_{BE}$ of $Q_1$ in FIG. 1, which reduces the offset and improves the linearity. For the two transistors:

$$V_{BE1} = V_T \ln \frac{I_{c1}}{I_{s1}}$$

$$V_{BE2} = V_T \ln \frac{I_{c2}}{I_{s2}}$$

where:

$$V_T = \frac{KT}{q}$$

$I_{c1}$ = collector current of transistor $Q_1$
$I_{c2}$ = collector current of transistor $Q_2$
$I_{s1}$ = saturation current of transistor $Q_1$
$I_{s2}$ = saturation current of transistor $Q_2$ The circuit of FIG. 2 has a lower offset than that of FIG. 1. However the $I_S$ of a PNP and of an NPN are not related to each other and vary independently with process variations. Furthermore, the collector current of $Q_2$ varies with the input voltage, whereas the collector current of $Q_1$ is fixed. Therefore the offset of the circuit is still fairly large due to the variation in process parameters, and the circuit still has a non-linearity due to the variation in $V_{BE2}$ with input voltage.

Figure 3:
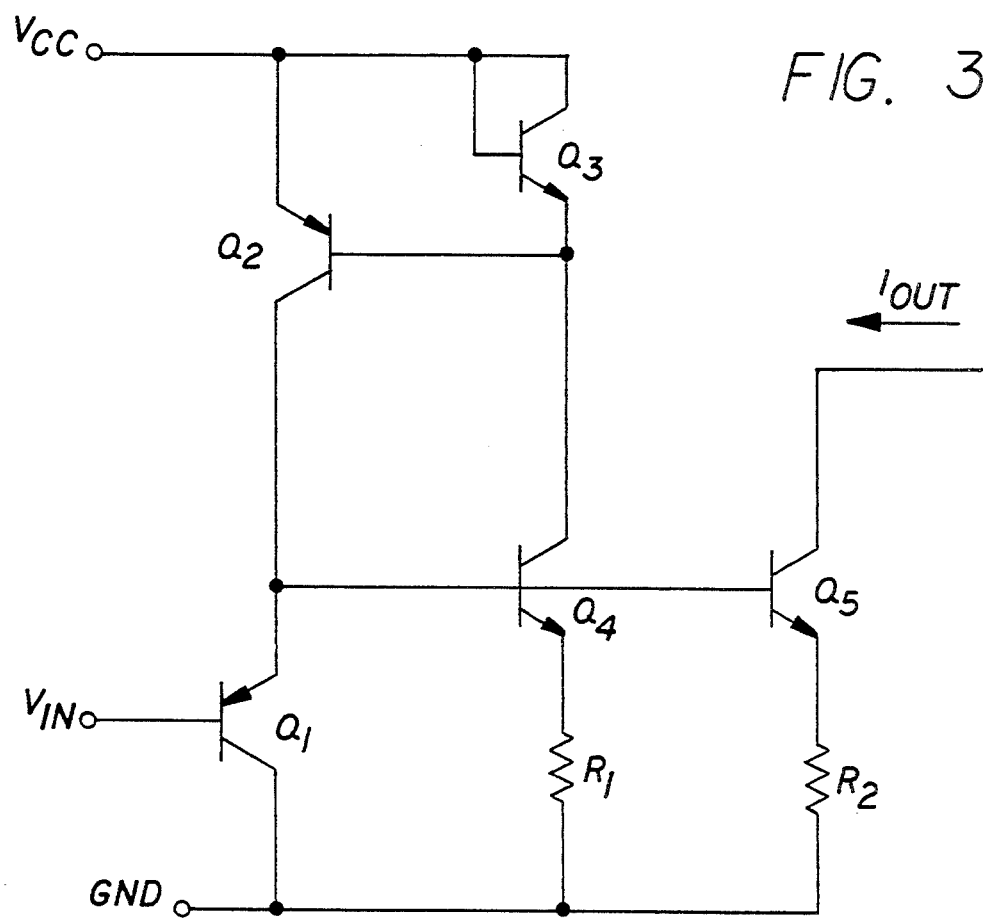
FIG. 3 presents a transconductance circuit incorporating a way to match the $V_{BE}$ of PNP and NPN transistors, regardless of the process variations or the operating condition of the circuit.

What is required is some means of controlling the $V_{BE}$ of $Q_1$ to match the $V_{BE}$ of $Q_2$, regardless of the process variations or the operating condition of the circuit. The circuit to accomplish this is shown in FIG. 3, and forms the basis for this invention. In the circuit shown in FIG. 3, $Q_3$, $Q_4$ and $Q_5$ are identical devices. (Alternatively, $Q_5$ may be a larger device, but should operate at the same current density as $Q_3$ and $Q_4$.) $Q_1$ and $Q_2$ are also identical devices and $R_1 = R_2$. In the analysis that follows, base currents and output impedance effects of the transistors are ignored.

Since $Q_3$, $Q_4$ and $Q_5$ are identical and $R_1 = R_2$, a replica of the output current flows through $Q_4$ and thus through $Q_3$ in series therewith. Also $V_{BE3} = V_{BE4} = -V_{BE5}$ because of the identical transistors and equal currents.

$Q_1$ is biased from a PNP transistor $Q_2$ whose base-emitter is connected across the emitter-base of diode connected transistor $Q_3$ and is thus equal thereto. Because $Q_1$ and $Q_2$ are identical devices and the two transistors are connected in series so as to have the same current therethrough, the $V_{BE}$ of $Q_1$ is equal to and tracks the $V_{BE}$ of $Q_3$.

$$\text{i.e. } V_{BE1} = V_{BE5} \therefore I_{out} = \frac{V_{IN}}{R_2}$$

Thus the offset and non-linearity due to unequal $V_{BE}$s, is to a first order approximation, eliminated.

The circuit has been linearized by the addition of positive feedback. The loop gain is less than unity because of $R_1$. Also since the loop gain in less than unity, the circuit does not need to be frequency compensated, which makes high speed operation possible. However, the circuit of FIG. 3 has some drawbacks.

1) The operating current in the input follower $Q_1$ depends both on the input voltage and the ratio of the currents of the PNP and NPN transistors. The ratio of the currents is not controlled in typical processes, which leads to a significant variability in the operating current of $Q_1$.

2) The output impedance of $Q_2$ will cause an error.

3) The $\alpha$ loss of $Q_5$ causes an error.

4) The circuit has a stable operating point with zero current regardless of the input voltage, i.e. it needs a start-up circuit.

Figure 4:
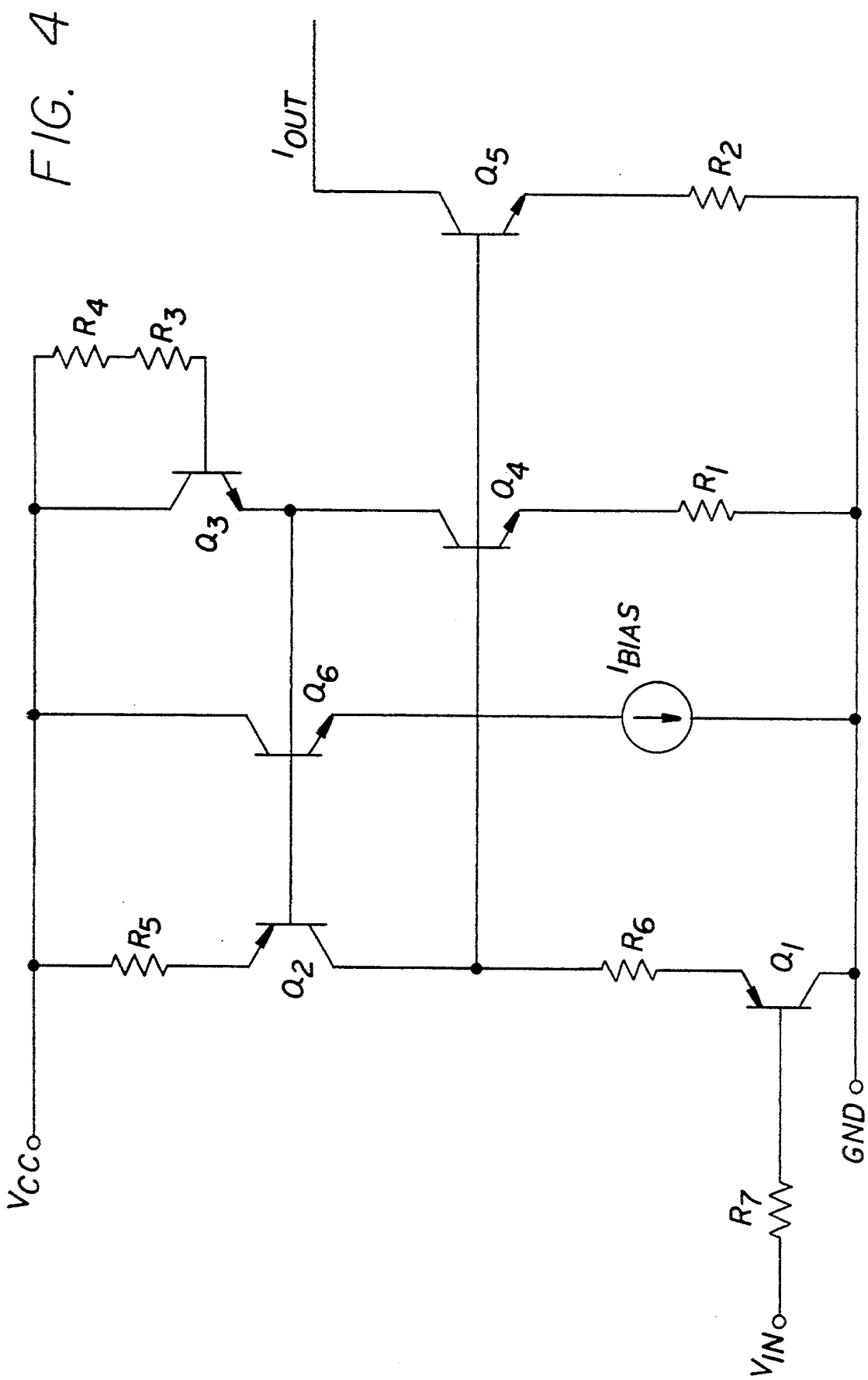
FIG. 4 presents a modified and improved version of the circuit of FIG. 3.

The circuit of FIG. 3 can be modified as shown in FIG. 4 to solve the above problems. In this figure, $R_5$ is added to limit the current in $Q_2$ and increase its output impedance. Matching resistor $R_6$ is added in the emitter of $Q_1$. The alpha-loss of $Q_2$ is compensated by $R_7$ ($R_5=R_6=R_7$). The current in $Q_1$ and $R_6$ is diminished by the base currents of $Q_4$ and $Q_5$. $R_4$, which equals 2 * $R_5$, compensates for this effect. The alpha-loss of $Q_5$ is compensated by the addition of $R_3$, which equals $R_2$. Finally, start-up is ensured by the base current of $Q_6$. $I_{bias}$ is a small current, typically less than 5 micro amps. These modifications substantially improve the performance of the circuit. (In a typical implementation, $R_3$ and $R_4$ will be combined into a single resistance in this and the other embodiments disclosed.)

Figure 5:
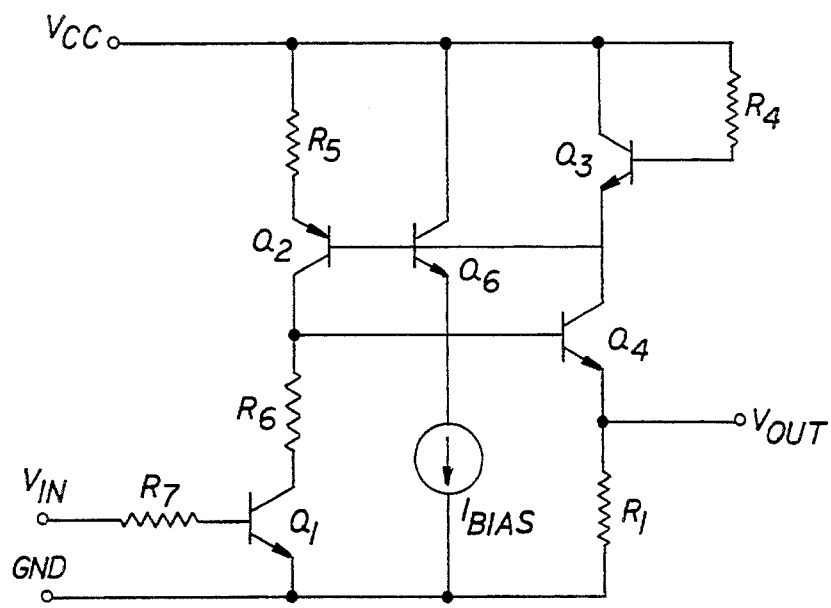
FIG. 5 presents the circuit of FIG. 4 used as a unity gain buffer.
Figure 6:
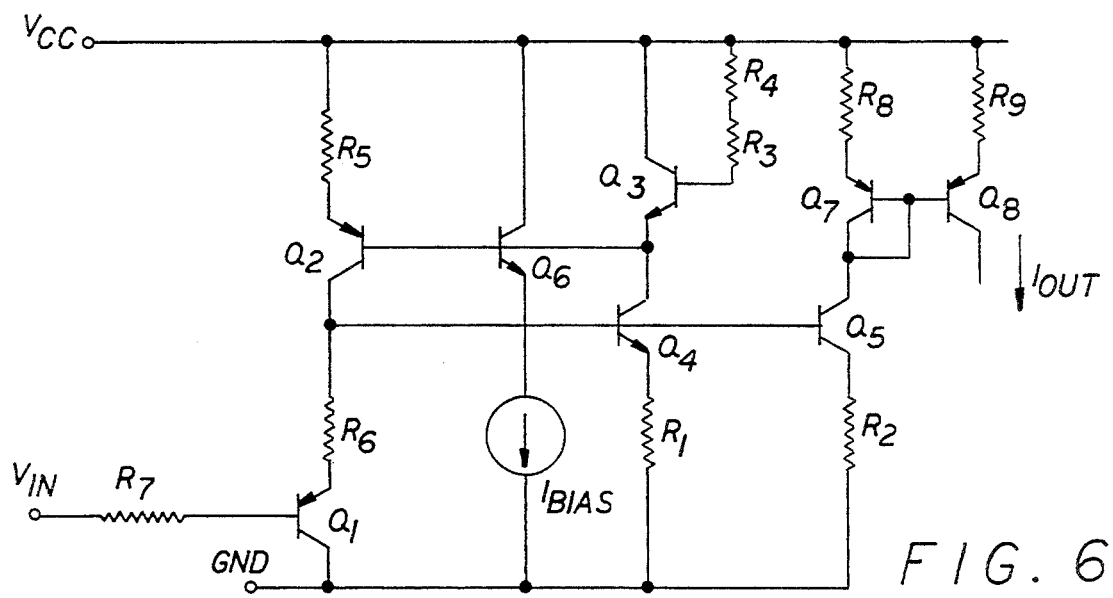
FIG. 6 presents a modification of FIG. 4 to provide an output current source rather than the output current sink of FIG. 4.

The basic transconductance circuit is a versatile building block for many applications. An example of the above circuit as a unity gain buffer wherein $R_4=R_5=R_6=R_7$ is shown in FIG. 5. In the embodiment shown in FIG. 4, the output is an output current sink. If an output current source is desired, the sink current of FIG. 4 may be mirrored, as shown in FIG. 6, through $Q_7$ to the collector of $Q_8$ to provide the current source output, equal to the sink output of FIG. 4 if $Q_7$ and $Q_8$ are identical transistors and $R_8=R_9$, or ratioed to a different current scale factor if the areas of transistors $Q_7$ and $Q_8$ and conductances of resistors $R_8$ and $R_9$ are each correspondingly ratioed.

Figure 7:
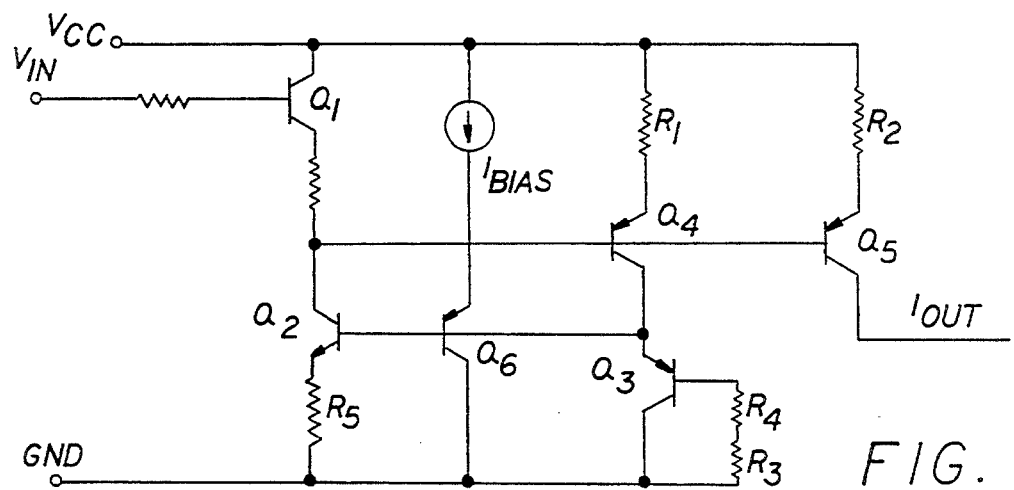
FIG. 7 presents the circuit of FIG. 4 modified to reference the input to the high input power connection.
Figure 5:
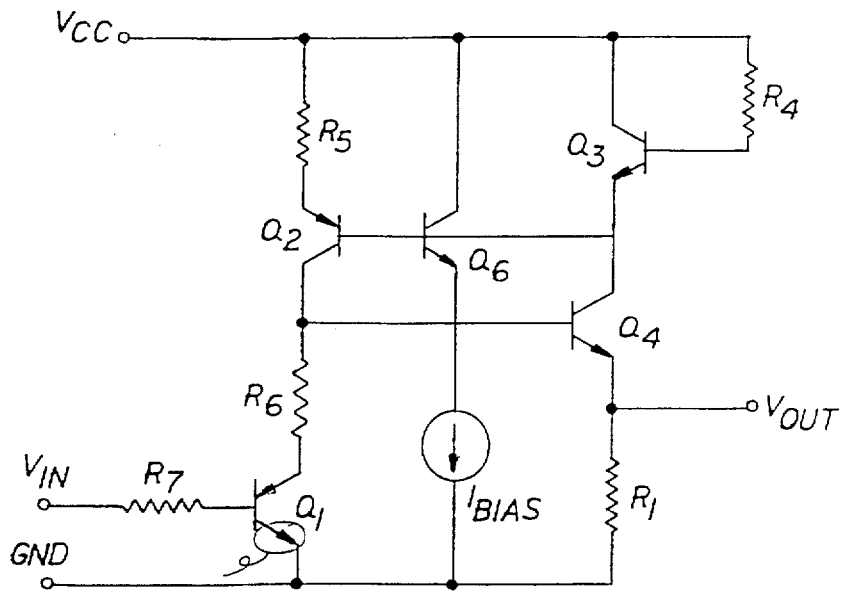
Figure 6:
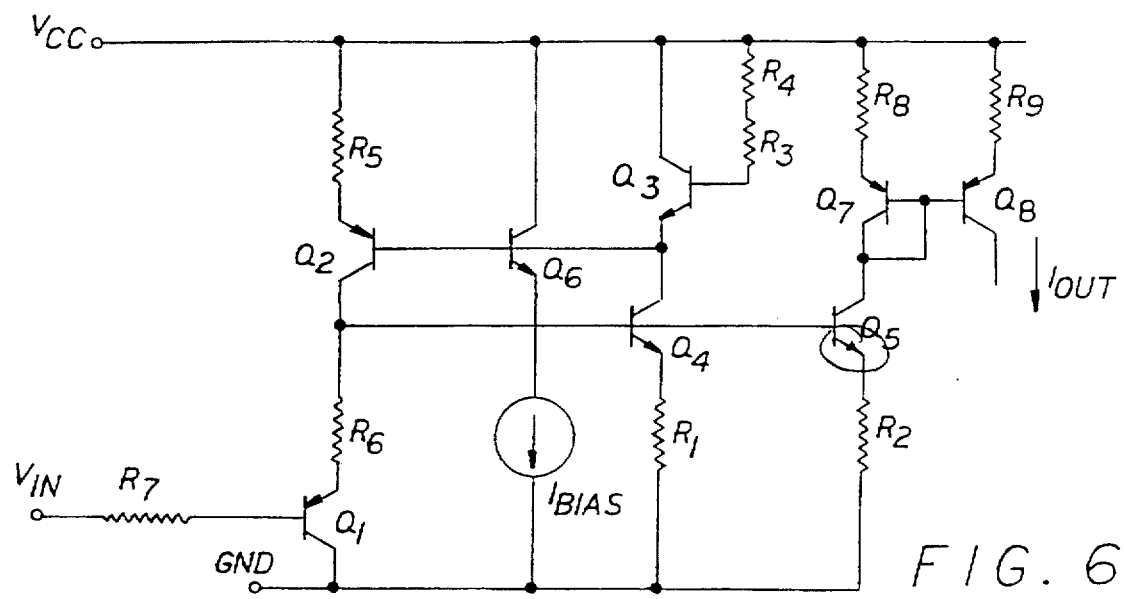
Figure 7:
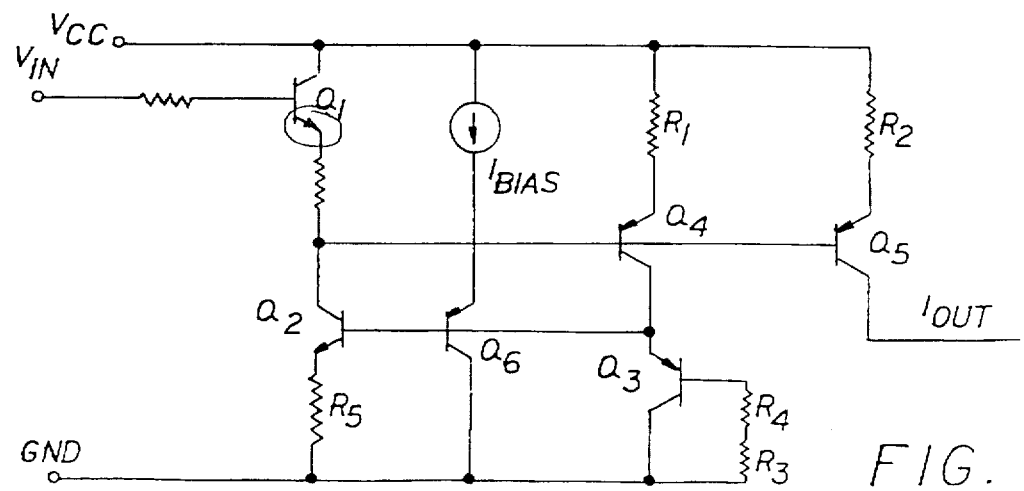

The inputs for the circuits of FIG. 3 through FIG. 6 are referenced to the ground or low terminal of the power supply. If it is desired to reference the same to Vcc or high terminal of the power supply, the circuits may be flipped by swapping NPN transistors for the PNP transistors and vice versa and reversing the power supply terminals (and the direction of any current sources in the circuit). As an example of this, FIG. 7 presents the circuit of FIG. 4 modified in this manner to reference the input to the high input power connection.

Similarly, the circuits of the present invention may also be realized in CMOS circuitry by replacing the NPN transistors with n-channel MOSFET devices and the PNP transistors with p-channel MOSFET devices. Thus, while the present invention has been disclosed and described with respect to certain preferred embodiments thereof, it will be understood to those skilled in the art that the present invention may be varied without departing from the spirit and scope of the invention.

I claim:

1. A transconductance amplifier comprising:
   first and second power supply connections, an input connection and an output connection;
   first and second transistors of a first conductivity type, and third, fourth and fifth transistors of a second conductivity type, each having an emitter, a base and a collector;
   said first transistor having its collector coupled to said second power supply connection, its base coupled to said input connection and its emitter coupled to the collector of said second transistor and the bases of said fourth and fifth transistor;
   said second transistor having its emitter coupled to said first power supply connection;
   said third transistor having its collector and base coupled to said first power supply connection and its emitter coupled to the base of said second transistor and to the collector of said fourth transistor;
   said fourth and fifth transistors having their emitters coupled to said second power supply connection;
   said fifth transistor having its collector coupled to said output connection.

2. The transconductance amplifier of claim 1 wherein said first and second transistors are substantially identical to each other and said third and fourth transistors are substantially identical to each other.

3. The transconductance amplifier of claim 1 wherein said fourth and fifth transistors each have their emitters coupled to said second power supply connection through a respective first and second resistor.

4. The transconductance amplifier of claim 1 wherein said first transistor has its emitter coupled through a first resistor to the collector of said second transistor and the bases of said fourth and fifth transistor, said second transistor has its emitter coupled to said first power supply connection through a second resistor, and said third transistor has its base coupled to said first power supply connection through a third resistor.

5. The transconductance amplifier of claim 1 further comprised of means for conducting current between the base of said second transistor and said second power supply connection.

6. The transconductance amplifier of claim 5 wherein the means for conducting current between the base of said second transistor and said second power supply connection comprises a sixth transistor of a second conductivity type having its collector coupled to said first power supply connection, its base coupled to the base of said second transistor and its emitter coupled to said second power supply connection through a current source.

7. The transconductance amplifier of claim 1 wherein said fourth and fifth transistors each have their emitters coupled to said second power supply connection through a respective first and second resistors, said first transistor has its emitter coupled through a third resistor to the collector of said second transistor and the bases of said fourth and fifth transistor, said second transistor has its emitter coupled to said first power supply connection through a fourth resistor, and said third transistor has its base coupled to said first power supply connection through a fifth resistor, said first and second resistors being approximately equal and said third and fourth resistors being substantially equal.

8. The transconductance amplifier of any of claims 1, 2, 5, 6 or 7 wherein the transistors of the first conductivity type are PNP transistors and the transistors of the second conductivity type are NPN transistors, and said first and second power supply connections are positive and negative power supply connections, respectively.

9. The transconductance amplifier of any of claims 1, 2, 5, 6 or 7 wherein the transistors of the first conductivity type are NPN transistors and the transistors of the second conductivity type are PNP transistors, and said first and second power supply connections are negative and positive power supply connections, respectively.

10. The transconductance amplifier of claim 1 wherein said fifth transistor has its collector coupled to said output connection through a current mirror.

11. A transconductance amplifier comprising:
first and second power supply connections, an input connection and an output connection;
first and second substantially identical transistors of a first conductivity type, and third, fourth and fifth transistors of a second conductivity type, said third and fourth transistors being substantially identical to each other, each of said transistors having an emitter, a base and a collector;
said first transistor having its collector to said second power supply connection, its base coupled to said input connection and its emitter coupled through a first resistor to the collector of said second transistor and the bases of said fourth and fifth transistor;
said second transistor having its emitter coupled through a second resistor to said first power supply connection, said first and second resistors being substantially equal;
said third transistor having its collector coupled to said first power supply connection, its base coupled through a third resistor to said first power supply connection, and its emitter coupled to the base of said second transistor and to the collector of said fourth transistor;
said fourth and fifth transistors having their emitters coupled, each through a respective one of fourth and fifth resistors to said second power supply connection;
said fifth transistor having its collector coupled to said output connection; and,
means for conducting current between the base of said second transistor and said second power supply connection.

12. The transconductance amplifier of claim 11 wherein the means for conducting current between the base of said second transistor and said second power supply connection comprises a sixth transistor of a second conductivity type having its collector coupled to said first power supply connection, its base coupled to the base of said second transistor and its emitter coupled to said second power supply connection through a current source.

13. The transconductance amplifier of any of claims 11 and 12 wherein the transistors of the first conductivity type are PNP transistors and the transistors of the second conductivity type are NPN transistors, and said first and second power supply connections are positive and negative power supply connections, respectively.

14. The transconductance amplifier of any of claims 11 and 12 wherein the transistors of the first conductivity type are NPN transistors and the transistors of the second conductivity type are PNP transistors, and said first and second power supply connections are negative and positive power supply connections, respectively.

* * * * *

UNITED STATES PATENT AND TRADEMARK OFFICE
CERTIFICATE OF CORRECTION

PATENT NO.  :   5,446,414
DATED  :   August 29, 1995
INVENTOR(S)  :   Kolluri It is certified that error appears in the above-identified patent and that said Letters Patent is hereby corrected as shown below:

In column 1 at line 31, please delete " in, the " and insert -- in the --

The drawing sheet, consisting of Figs. 5 and 7, should be deleted tohe replaced with the drawing sheets, consisting of Figs. 5-7, as shown on the attached page.

Signed and Sealed this

Thirteenth Day of July, 1999

Attest:

Attesting Officer

Q. TODD DICKINSON

Acting Commissioner of Patents and Trademarks